United States Patent
Wajima et al.

[11] Patent Number: 6,054,797
[45] Date of Patent: Apr. 25, 2000

[54] ENERGY-TRAPPING PIEZOELECTRIC RESONATOR

[75] Inventors: Masaya Wajima, Sinminato; Jiro Inoue, Omihachiman; Hiroaki Kaida, Moriyama; Mitsuhiro Yamada, Shiga-ken, all of Japan

[73] Assignee: Murata Manufacturing Co., Ltd., Japan

[21] Appl. No.: 09/058,593

[22] Filed: Apr. 10, 1998

[30] Foreign Application Priority Data

Apr. 14, 1997 [JP] Japan .................................... 9-095887
Jun. 13, 1997 [JP] Japan .................................... 9-157124

[51] Int. Cl.$^7$ .................................................. H01L 41/08
[52] U.S. Cl. ............................................................. 310/320
[58] Field of Search ...................................... 310/320, 321

[56] References Cited

U.S. PATENT DOCUMENTS

| | | | |
|---|---|---|---|
| 4,265,841 | 5/1981 | Fujimori et al. | 264/22 |
| 4,367,426 | 1/1983 | Kumada et al. | 310/358 |
| 4,486,682 | 12/1984 | Nakazawa et al. | 310/361 |
| 4,511,202 | 4/1985 | Kasai | 310/321 |
| 4,577,132 | 3/1986 | Ohigashi et al. | 310/800 |
| 5,925,968 | 7/1999 | Yachi et al. | 310/320 |

Primary Examiner—Thomas M. Dougherty
Attorney, Agent, or Firm—Graham & James LLP

[57] ABSTRACT

An energy-trapping piezoelectric resonator vibrates in a third-order wave of a thickness-extension vibration mode. The piezoelectric resonator includes a piezoelectric substrate polarized along its thickness. A ratio of the width W to the thickness T of the substrate is determined to be about 0.88±5%, 1.06±4%, 1.32±5%, 1.80±3%, 2.30±3%, 2.69±3%, 3.16±2%, or 3.64±2%. First and second electrodes are respectively disposed on the obverse and reverse surfaces of the substrate to cover the entire width and opposedly face each other at the central portion of the substrate in the longitudinal direction so as to form a resonance portion between the first and second electrodes. It is thus possible to obtain a piezoelectric resonator which does not require a large extra area of the substrate around the resonance portion and which exhibits good resonance characteristics by effectively suppressing unwanted spurious responses in a range between and near the resonant frequency and the anti-resonant frequency.

4 Claims, 15 Drawing Sheets

ENERGY-TRAPPING PIEZOELECTRIC RESONATOR

BACKGROUND OF THE INVENTION

1. Field of the Invention

The present invention relates to energy-trapping piezoelectric resonators which vibrate in a thickness-extension vibration mode, and more particularly, to an energy-trapping piezoelectric resonator which vibrates in a thickness-extension vibration mode and is incorporated in a piezoelectric filter or a piezoelectric oscillator.

2. Description of the Related Art

An example of an energy-trapping piezoelectric resonator vibrating in a thickness-extension mode is disclosed in Japanese Examined Patent Publication No. 7-70941. The structure of this resonator will now be described with reference to FIG. 20. A piezoelectric resonator generally designated by 51 includes a rectangular piezoelectric substrate 52 polarized in a thickness direction thereof. A resonance electrode 53a is disposed on the central portion of the upper surface of the substrate 52 and a resonance electrode 53b is disposed at the central portion of the lower surface of the substrate 52 so as to opposedly face the resonance electrode 53a. The resonance electrodes 53a and 53b are electrically connected to lead electrodes 54a and 54b, respectively, which are provided along opposite edges of the substrate 52.

The above-described piezoelectric resonator 51 experiences the following problem. The resonance electrodes 53a and 53b must be located at the central portions of the substrate 52 so as to trap vibration energy in the opposing region (resonance portion) located between the resonance electrodes 53a and 53b. Accordingly, a comparatively large piezoelectric substrate 52 is required to ensure a sufficient area around the resonance portion of the substrate 52. This prevents the size of the piezoelectric resonator 51 from being reduced.

To overcome the above drawback, Japanese Unexamined Patent Publication No. 2-235422 discloses an energy-trapping piezoelectric resonator utilizing the thickness-extension vibration mode which does not require a large area around the resonance portion of the piezoelectric substrate. In this resonator 61, as illustrated in FIG. 21, a resonance electrode 63a is disposed on the upper surface of a narrow piezoelectric ceramic substrate 62 and a resonance electrode 63b is disposed on the lower surface of the ceramic substrate 62. The resonance electrodes 63a and 63b are arranged so as to cover the overall width of the substrate 62. Also, a resonance portion is provided in an opposing region between the resonance electrodes 63a and 63b at the center of the substrate 62 in the longitudinal direction. The resonance electrodes 63a and 63b extend to lateral edges 62a and 62b, respectively, in the widthwise direction of the substrate 62.

In the above-described piezoelectric resonator 61 in which the thickness-extension vibration mode is generated in the narrow piezoelectric substrate 62, unwanted vibrations are caused due to the relationship between a width W and a thickness T of the substrate 62. Thus, Japanese Unexamined Patent Publication No. 2-235442 states that unwanted spurious responses in a range between the resonant frequency and the anti-resonant frequency can be reduced by determining the ratio W/T in the following manner. The ratio W/T is determined to be approximately 5.33 at a resonant frequency of 16 MHz when a fundamental wave is utilized. On the other hand, W/T is determined to be approximately 2.87 at a resonant frequency of 16 MHz when a third-order wave is utilized.

When a prototype of the piezoelectric resonator 61 was actually prepared and tested, however, unwanted spurious responses were still generated between the resonant frequency and the anti-resonant frequency, thereby preventing the filter from having good resonance characteristics.

SUMMARY OF THE INVENTION

To overcome the problems described above, the preferred embodiments of the present invention provide an energy-trapping piezoelectric resonator vibrating in a thickness-extension vibration mode and which resonator does not require a large extra area on the piezoelectric substrate near a resonance portion and which exhibits good resonance characteristics by effectively preventing or suppressing unwanted spurious responses in a range between a resonant frequency and an anti-resonant frequency of the resonator.

According to preferred embodiments of the present invention, there is provided an energy-trapping piezoelectric resonator utilizing a third-order wave of a thickness-extension vibration mode, the resonator including a piezoelectric substrate polarized along a thickness of the substrate, a ratio W/T of the width W to the thickness T of the piezoelectric substrate being 0.88±5%, 1.06±4%, 1.32±5%, 1.80±3%, 2.30±3%, 2.69±3%, 3.16±2%, or 3.64±2%; and first and second electrodes respectively disposed on top and bottom surfaces of the piezoelectric substrate to cover an entire width of the piezoelectric substrate and opposedly face each other at a central portion of the piezoelectric substrate relative to a longitudinal direction of the resonator.

According to another preferred embodiment of the present invention, in the piezoelectric resonator described in the preceding paragraph, the first electrode may extend to one lateral edge in a widthwise direction of the piezoelectric substrate, while the second electrode may extend to the other lateral edge in the widthwise-direction of the piezoelectric substrate.

According to yet another preferred embodiment of the present invention, a piezoelectric constant $d_{31}$ of a piezoelectric material used to form the piezoelectric substrate is preferably defined by:

$$|d_{31}| \leq 20 \times 10^{-12} C/N$$

The piezoelectric material may be a lead zirconate titanate-based ceramic, for example.

These and other features and advantages of the present invention will be described with reference to preferred embodiments thereof which are illustrated in the drawing figures.

DETAILED DESCRIPTION OF PREFERRED EMBODIMENTS

Figure 1:
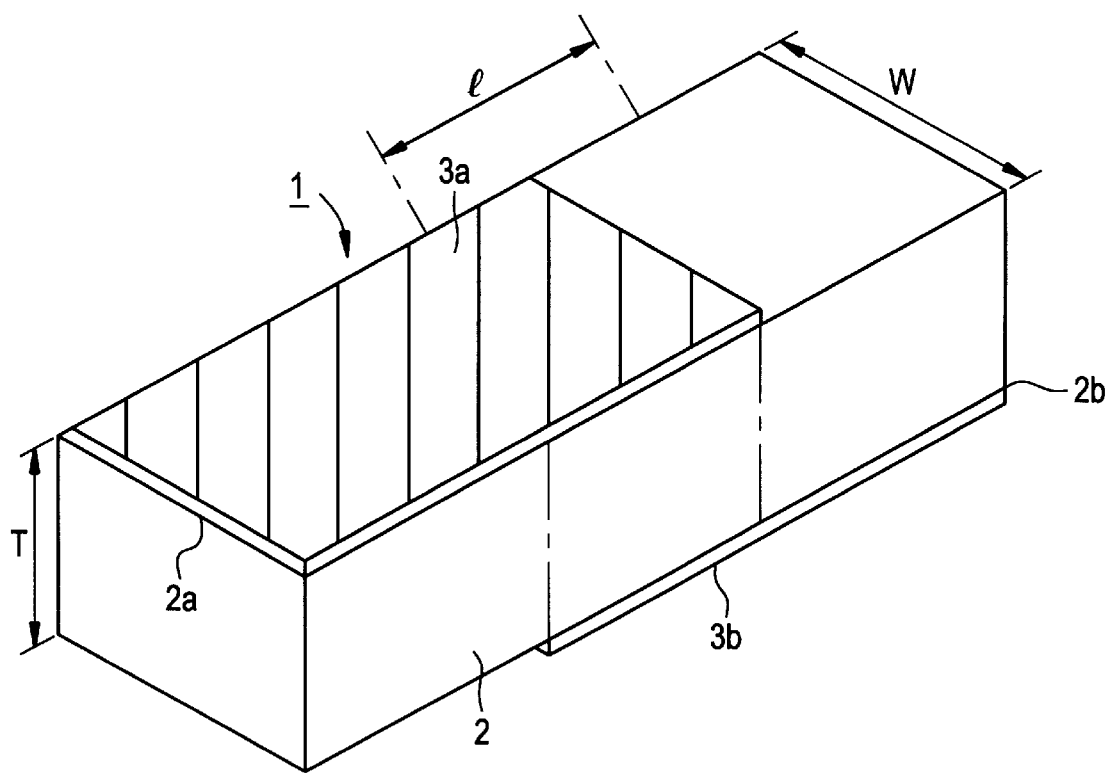
FIG. 1 is a perspective view illustrating an energy-trapping piezoelectric resonator according to a preferred embodiment of the present invention.

FIG. 1 is a perspective view illustrating an energy-trapping piezoelectric resonator according to a preferred embodiment of the present invention. An energy-trapping piezoelectric resonator generally indicated by 1 preferably includes a piezoelectric substrate 2, which may have a substantially rectangular shape as shown. The substrate 2 is preferably made of a piezoelectric ceramic, such as a lead titanate zirconate ceramic, and is polarized in the direction along the thickness P. The piezoelectric constant $d_{31}$ of a piezoelectric ceramic material is defined by:

$$|d_{31}| \leq 20 \times 10^{-12} C/N$$

A first electrode 3a is disposed at a central portion of the upper surface of the piezoelectric substrate 2 and a second electrode 3b is disposed at a central portion of the lower surface of the substrate 2. The first and second electrodes 3a and 3b extend to both lateral edges 2a and 2b and cover an entire whole width of the substrate 2. More specifically, the first electrode 3a extends to one edge 2a of the upper surface of the substrate 2 and the second electrode 3b extends to the other edge 2b of the lower surface of the substrate 2.

The first and second electrodes 3a and 3b opposedly face each other at the central portion in the longitudinal direction of the top and bottom surfaces of the substrate 2, thereby defining a resonance portion.

The first and second electrodes 3a and 3b do not have to be arranged to extend along the entire width of the piezoelectric substrate 2, except for at the opposing region between the first and second electrodes 3a and 3b on the top and bottom surfaces of the substrate 2. A portion of the electrodes 3a and 3b extending from the resonance portion to the edges 2a and 2b may be formed so as to be smaller than the width of the substrate 2.

The energy-trapping piezoelectric resonator 1 of this preferred embodiment utilizes the third-order wave of the thickness-extension vibration mode. The ratio W/T of the width W to the thickness T of the piezoelectric substrate 2 is preferably determined to be 0.88±5%, 1.06±4%, 1.32±5%, 1.80±3%, 2.30±3%, 2.69±3%, 3.16±2%, or 3.64±2%. With this arrangement, unwanted spurious responses are effectively prevented and suppressed in the resonance characteristics obtained by utilizing the third-order wave of the thickness-extension vibration mode. This will be explained based on the specific examples while referring to FIG. 1 and FIGS. 3 through 13.

To confirm this discovery, a plurality of piezoelectric substrates 2, made of a lead titanate zirconate ceramic, were prepared. The dimensions of the substrate 2 were determined as follows: the thickness T was 480 mm; the length L was 4.0 mm; and the widths W were differentiated between the substrates 2. The opposing length 1 of the first and second electrodes 3a and 3b was 0.9 mm. Under the above conditions, a plurality of piezoelectric resonators were produced with a resonant frequency of about 16 MHz.

Figure 3:
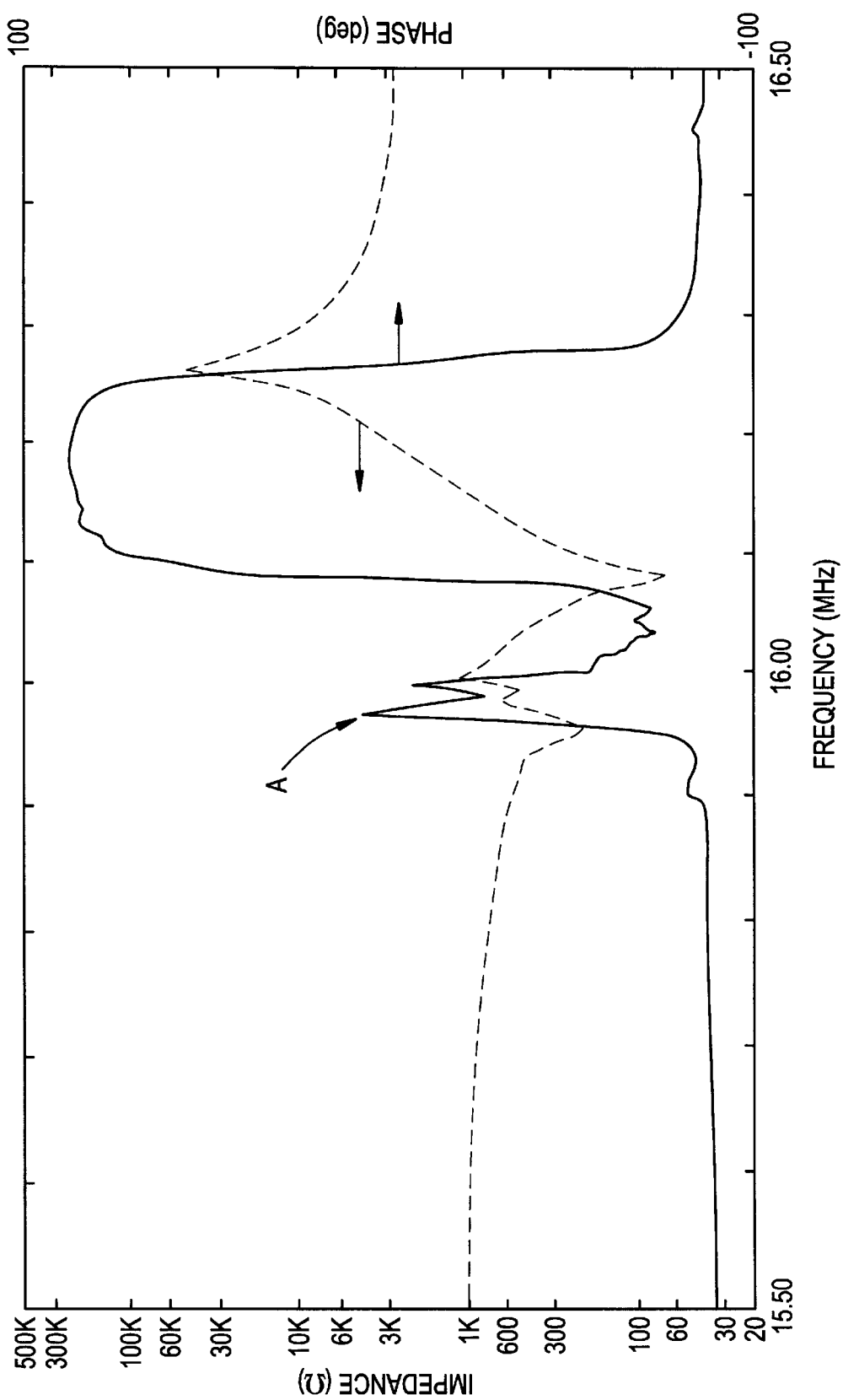
FIG. 3 illustrates impedance-vs.-frequency characteristics and phase-vs.-frequency characteristics exhibited by a piezoelectric resonator operated at a resonant frequency of about 16 MHz when the ratio W/T is determined to be approximately 2.60.
Figure 4:
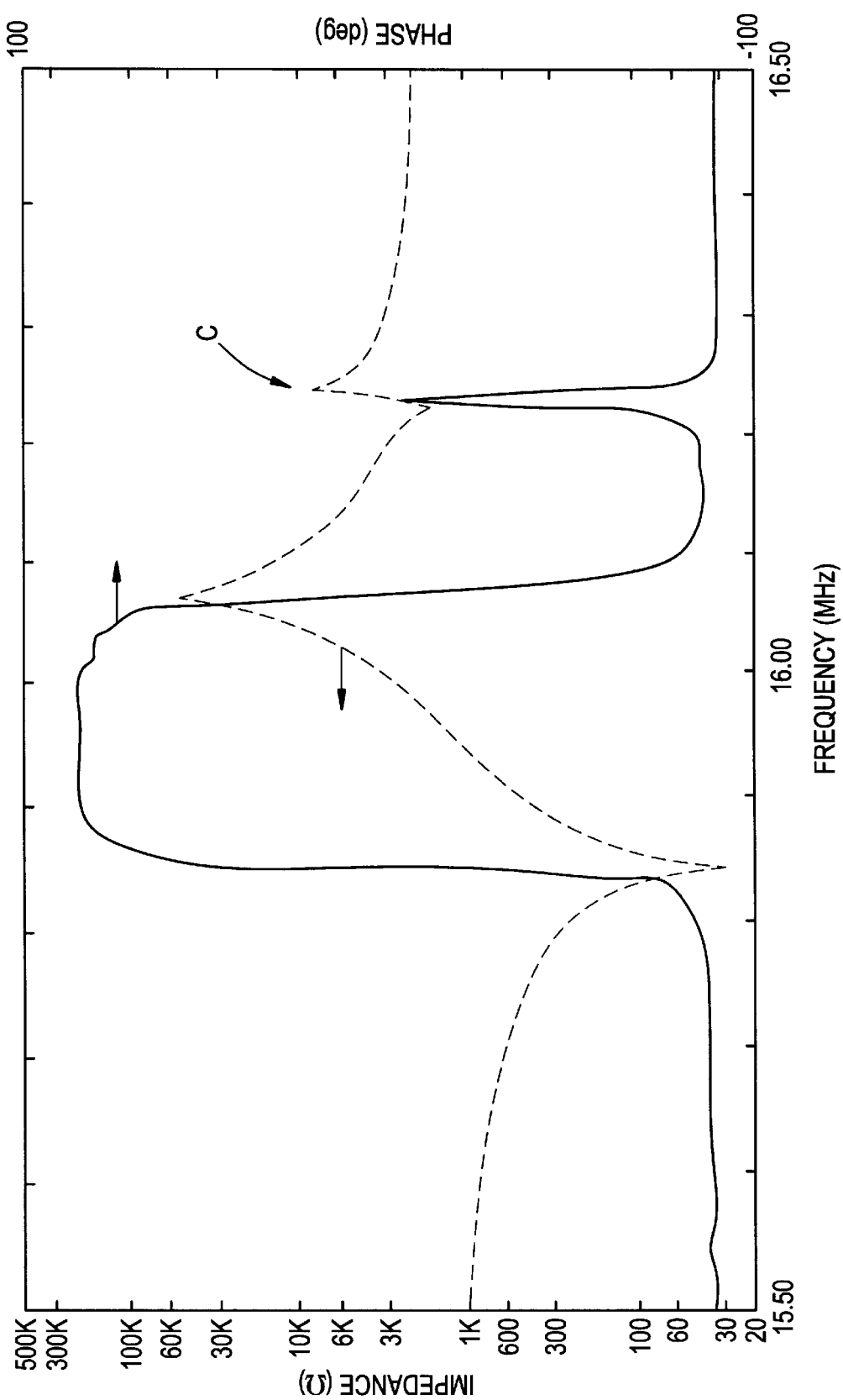
FIG. 4 illustrates impedance-vs.-frequency characteristics and phase-vs.-frequency characteristics exhibited by a piezoelectric resonator operated at a resonant frequency of 16 MHz when the ratio W/T is determined to be approximately 2.68.
Figure 5:
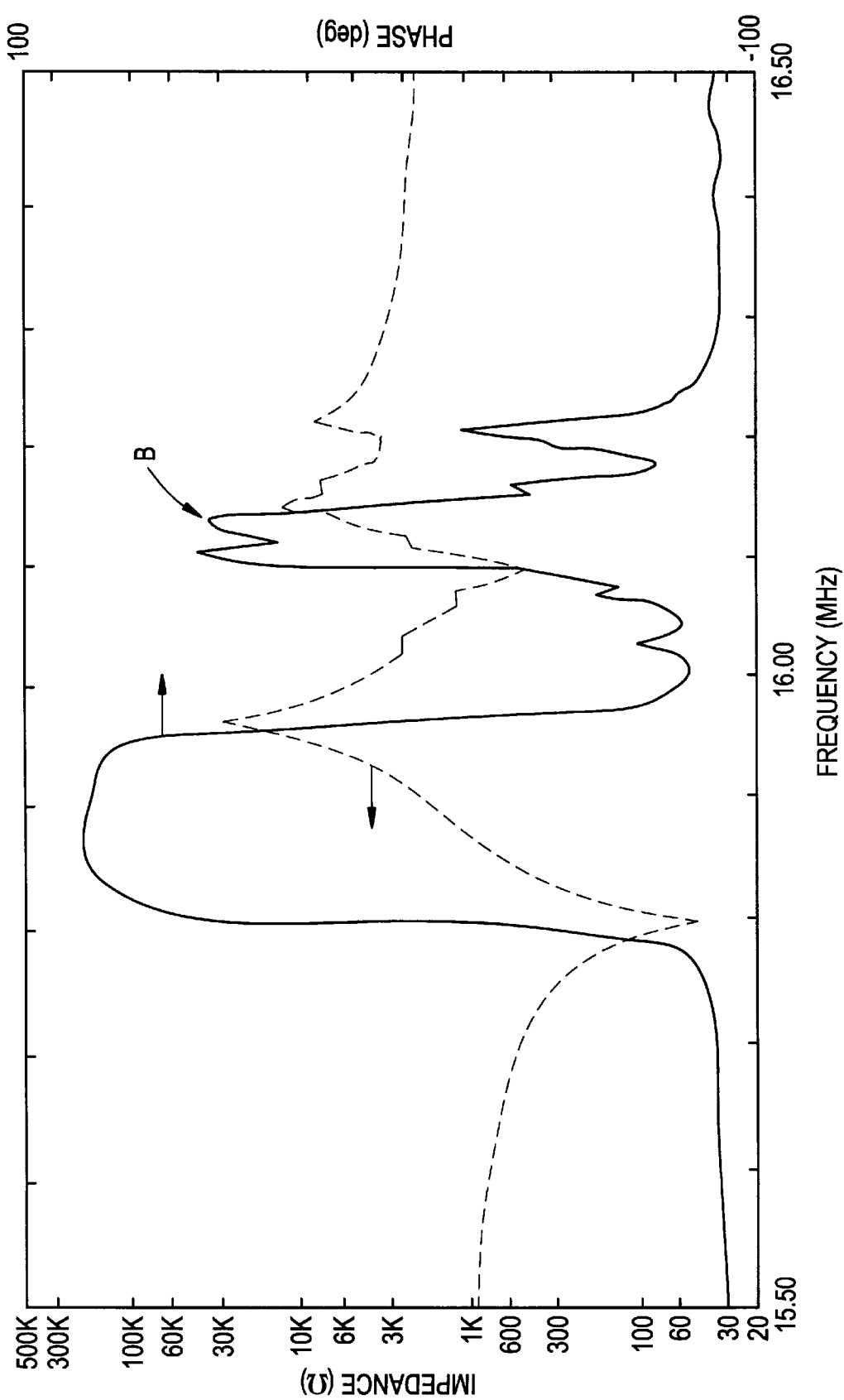
FIG. 5 illustrates impedance-vs.-frequency characteristics and phase-vs.-frequency characteristics exhibited by a piezoelectric resonator operated at a resonant frequency of about 16 MHz when a ratio W/T is determined to be approximately 2.76.
Figure 6:
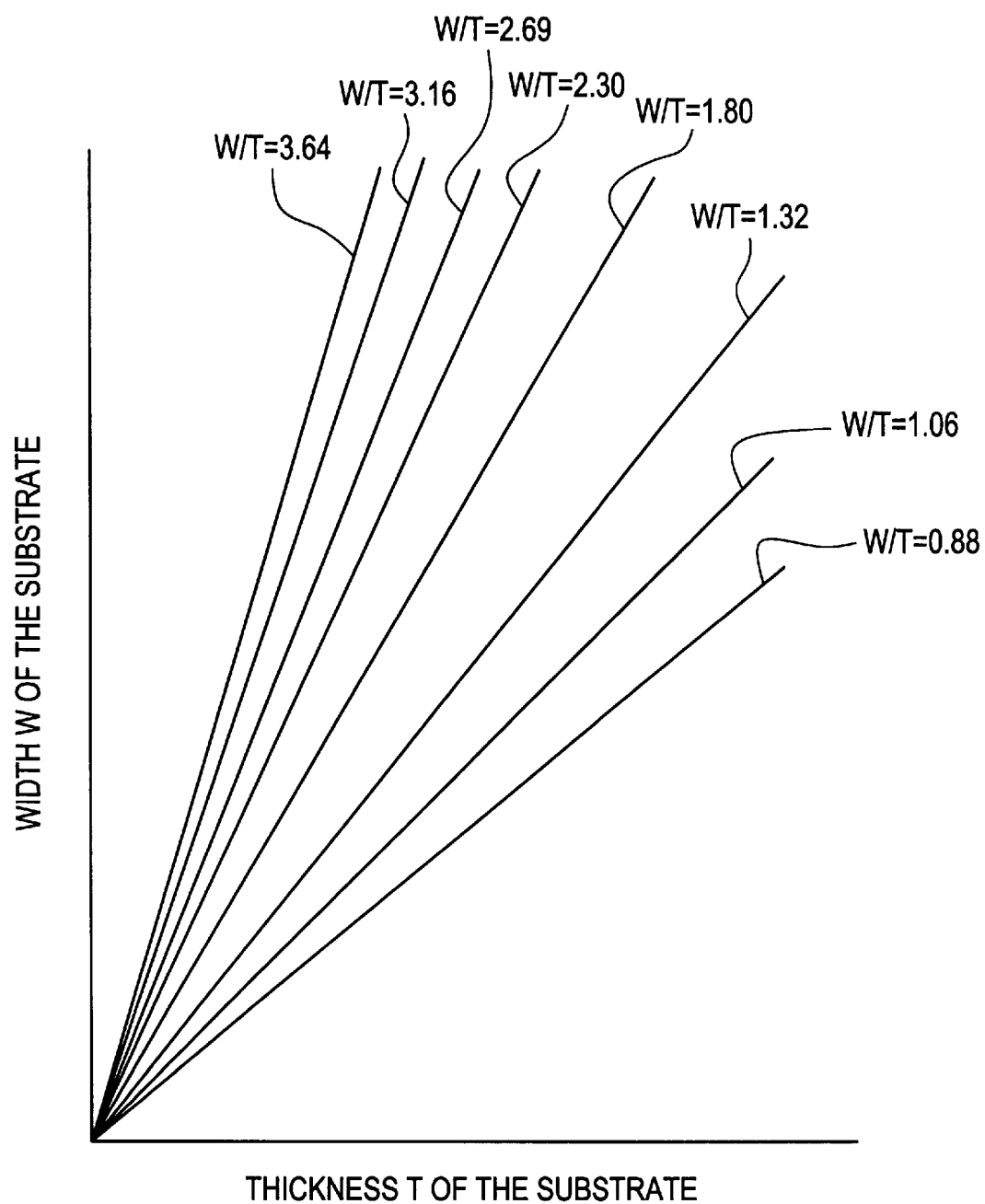
FIG. 6 illustrates the ratios W/T of piezoelectric resonators according to preferred embodiments of the present invention.

Among the piezoelectric resonators produced in the above manner, the impedance-vs.-frequency characteristics and the phase-vs.-frequency characteristics of the resonators having ratios W/T of 2.60, 2.68, and 2.76 are shown in FIGS. 3, 4 and 5, respectively. Upon comparison between FIGS. 3, 4 and 5, the resonator having a W/T of 2.60 exhibits the characteristics, as shown in FIG. 3, in which a large spurious response indicated by the arrow A appears in a frequency range lower than the resonant frequency fr. Further, the resonator having a W/T of 2.76 presents the characteristics, as illustrated in FIG. 5, in which a large spurious response indicated by the arrow B emerges in a frequency range higher than the anti-resonant frequency fa.

In contrast, the piezoelectric resonator having a W/T of 2.68 exhibits the characteristics, as shown in FIG. 4, in which no large spurious response appears in the range lower than the resonant frequency fr or in the range higher than the anti-resonant frequency fa. Although a higher-mode spurious response C appears, it is positioned in a range much higher than the anti-resonant frequency fa. Thus, there is a great frequency difference between the resonant frequency fr and the anti-resonant frequency fa in the resonance characteristics shown in FIG. 4, thereby achieving significantly improved resonance characteristics as compared to the prior art.

Then, the width W of the substrate was changed to prepare more varied types of piezoelectric resonators with a resonant frequency of about 16 MHz, and the impedance-vs.-frequency characteristics and the phase-vs.-frequency characteristics of the resonators were evaluated. It was then confirmed that, when the ratios W/T were determined to be approximately 0.88, 1.06, 1.32, 1.80, 2.30, 2.69, 3.16, and 3.64 indicated by FIG. 6, significantly improved resonance characteristics were obtained without having unwanted spurious responses in the vicinity of the resonant frequency fr and the anti-resonant frequency fa as in the characteristics shown in FIG. 4.

Subsequently, measurement was made to determine a change in the spurious response A (FIG. 3) emerging in a range lower than the resonant frequency fr and a change in the spurious response B (FIG. 5) appearing in a range higher than the anti-resonant frequency fa when W/T was varied around the above eight values of W/T. The results are shown in FIG. 7 through 14.

Figure 7:
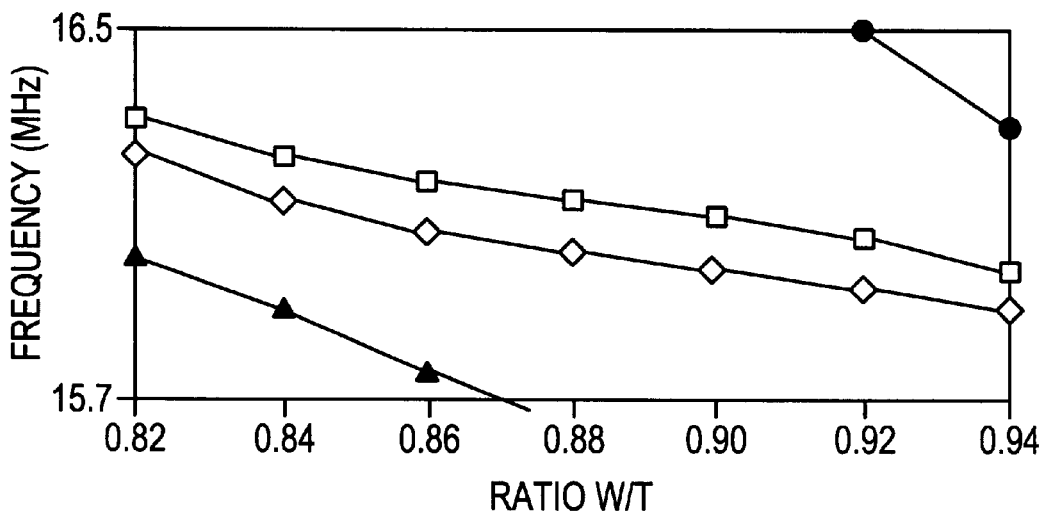
FIG. 7 illustrates the influences of lower and higher spurious responses when the ratio W/T is varied around 0.88 according to a preferred embodiment of the present invention.

FIGS. 7 through 14 illustrate behavior of the spurious responses A and B by changing the ratio W/T near the above-described respective eight values. This will be explained with reference to, for example, FIG. 7. FIG. 7 illustrates the influences of the spurious responses A and B when the ratio W/T is changed in the vicinity of 0.88. In FIG. 7, _ indicates the resonant frequency fr; o represents the anti-resonant frequency fa; s designates the lower spurious response A; and 1 indicates the higher spurious response B.

For example, FIG. 7 reveals that no spurious responses A and B emerge in the frequency range from 15.7 MHz to 16.5 MHz when W/T is about 0.88. Thus, significantly improved resonance characteristics as those shown in FIG. 4 are achieved with this ratio W/T.

In FIGS. 7 through 14, significantly improved resonance characteristics are obtained in a frequency range near the resonant frequency of 16 MHz when the spurious responses A and B are not placed in proximity with the resonant frequency fr and the anti-resonant frequency fa, respectively. Excellent resonance characteristics are also achieved when there is a sufficient difference between the resonant frequency fr and the anti-resonant frequency fa because the magnitude of the spurious responses A and B is small even if the spurious responses A and B are relatively close to the resonant frequency fr and the anti-resonant frequency fa, respectively.

In FIG. 7, when, for example, W/T is about 0.82, the lower spurious response A emerges near 16.0 MHz, and the frequency difference between the resonant frequency fr and the anti-resonant frequency fa is smaller than that when W/T is, for example, about 0.88 since the spurious response A is positioned in proximity with the resonant frequency fr. When W/T is about 0.94, the higher spurious response B appears in the vicinity of 16.3 MHz, and the frequency difference between the resonant frequency fr and the anti-resonant frequency fa is smaller than that when W/T is, for example, about 0.88 because the spurious response B is close to the anti-resonant frequency fa.

FIG. 7 also indicates that the lower spurious response A is shifted to the lower frequency side and is farther away from the resonant frequency fr as W/T increases from about 0.82, thereby producing a less adverse influence on the resonance characteristics. On the other hand, the higher spurious response B is shifted to the higher frequency side and is farther away from the anti-resonant frequency fa as W/T decreases from about 0.94, thereby producing a less adverse influence on the resonance characteristics. Accordingly, the ratio W/T should preferably be in the range from about 0.83 to about 0.92, i.e., in a range of 0.88±5%, in order to attain excellent resonance characteristics such as those shown in FIG. 4 in which the lower and higher spurious responses A and B are located away from the resonant frequency fr and the anti-resonant frequency fa, respectively, and do not adversely affect the resonance characteristics. In other words, the piezoelectric resonator 1 should be configured so that the ratio W/T is in a range of 0.88±5%, thereby obtaining good resonance characteristics indicated by FIG. 4.

Figure 8:
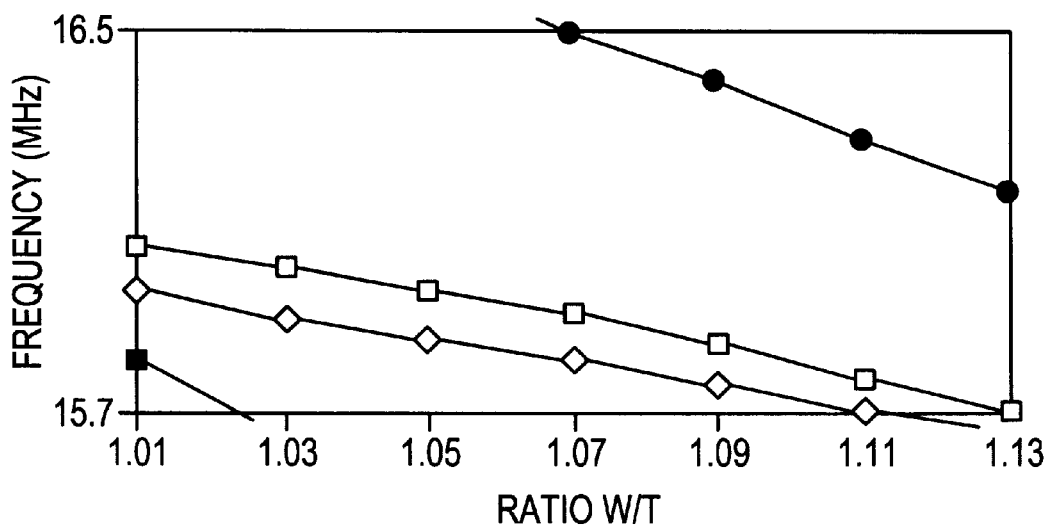
FIG. 8 illustrates the influences of lower and higher spurious responses when the ratio W/T is varied around 1.06 according to a preferred embodiment of the present invention.

FIG. 8 illustrates the influences of the spurious responses A and B when the ratio W/T is varied around 1.06. As is easily understood from the foregoing explanation with reference to FIG. 7, FIG. 8 reveals that, when W/T ranges from about 1.02 to about 1.1, i.e., when W/T is in a range of about 1.06±4%, the spurious responses A and B are positioned away from the resonant frequency fr and the anti-resonant frequency fa, respectively, and there is a greater frequency difference between the resonant frequency fr and the anti-resonant frequency fa, thereby obtaining good resonance characteristics.

Figure 9:
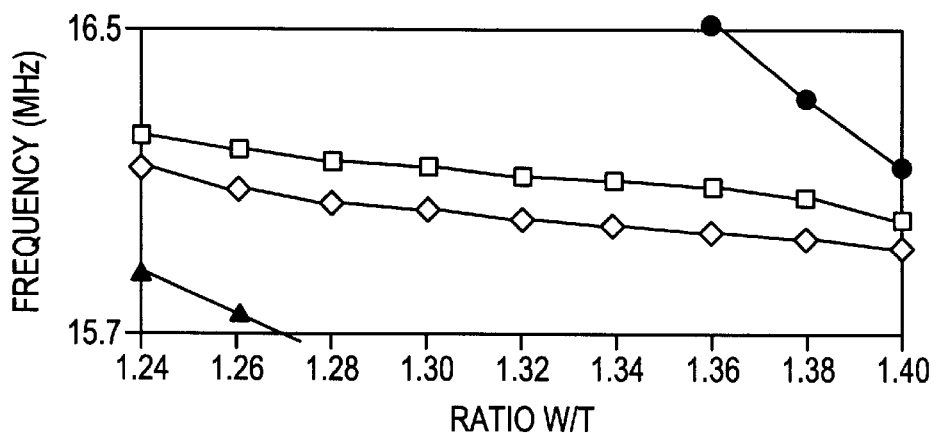
FIG. 9 illustrates the influences of lower and higher spurious responses when the ratio W/T is varied around 1.32 according to a preferred embodiment of the present invention.

FIG. 9 indicates that, when W/T ranges from about 1.25 to about 1.39, i.e., when W/T is in a range of about 1.32±5%, the lower spurious response A is spaced away from the resonant frequency fr and the higher spurious response B is spaced away from the anti-resonant frequency fa, and there is a larger frequency difference between the resonant frequency fr and the anti-resonant frequency fa, thereby achieving good resonance characteristics.

Figure 10:
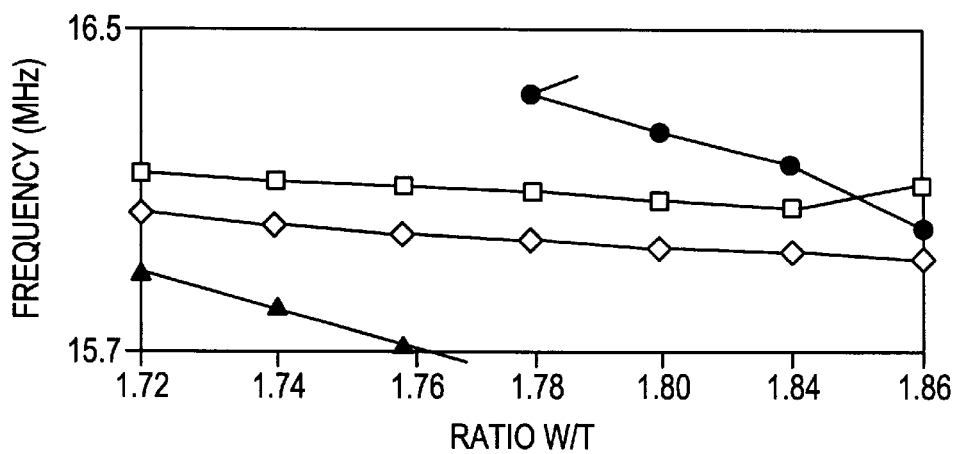
FIG. 10 illustrates the influences of lower and higher spurious responses when the ratio W/T is varied around 1.80 according to a preferred embodiment of the present invention.

As is seen from FIG. 10, when W/T ranges from about 1.75 to about 1.85, i.e., when W/T is in a range of about 1.80±3%, excellent resonance characteristics are achieved. It should be noted that, however, when W/T is about 1.86, the higher spurious response B is disadvantageously located between the resonant frequency fr and the anti-resonant frequency fa. Consequently, resonance characteristics are seriously impaired, thereby producing a large spurious response in the pass band. Moreover, when W/T is about 1.84, the higher spurious response B is relatively close to the anti-resonant frequency fa. At this point, however, there is a sufficiently large frequency difference between the resonant frequency fr and the anti-resonant frequency fa, and thus, the spurious response B is suppressed, thereby achieving excellent resonance characteristics.

Figure 11:
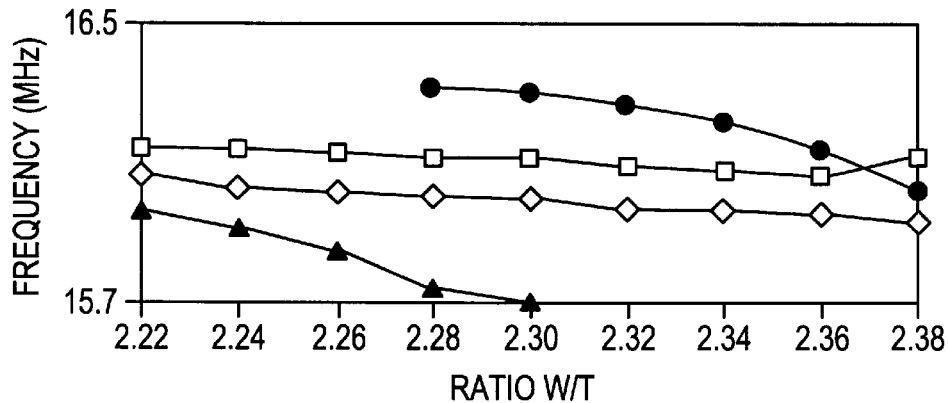
FIG. 11 illustrates the influences of lower and higher spurious responses when the ratio W/T is varied around 2.30 according to a preferred embodiment of the present invention.

FIG. 11 illustrates that, when W/T ranges from about 2.23 to about 2.37, i.e., when W/T is in a range of about 2.30±3%, the resonance characteristics are substantially protected from the lower and higher spurious responses A and B, thereby achieving excellent resonance characteristics.

Figure 12:
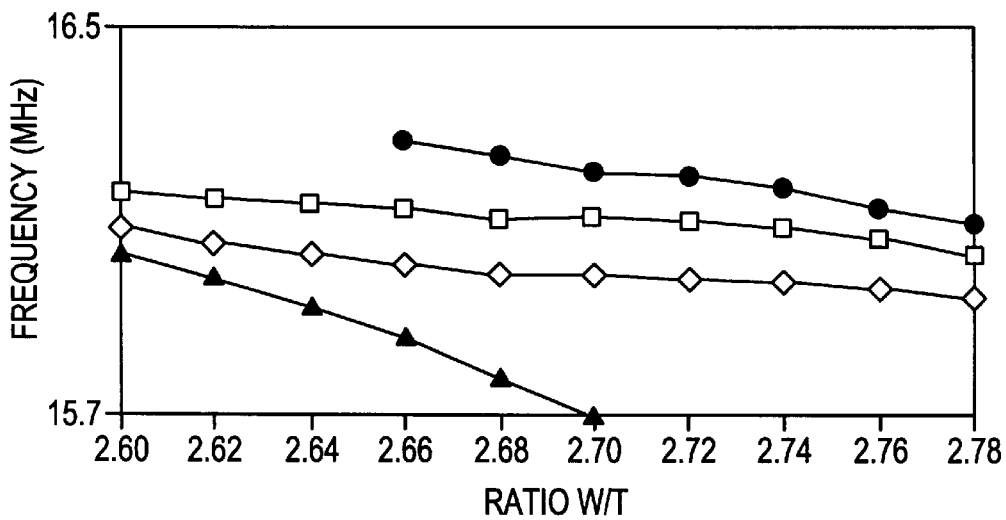
FIG. 12 illustrates the influences of lower and higher spurious responses when the ratio W/T is varied around 2.69 according to a preferred embodiment of the present invention.

FIG. 12 reveals that, when W/T ranges from about 2.6 to about 2.77, i.e., when W/T is in a range of about 2.69±3%, the resonance characteristics are substantially protected from the lower and higher spurious responses A and B, thereby achieving excellent resonance characteristics.

Figure 13:
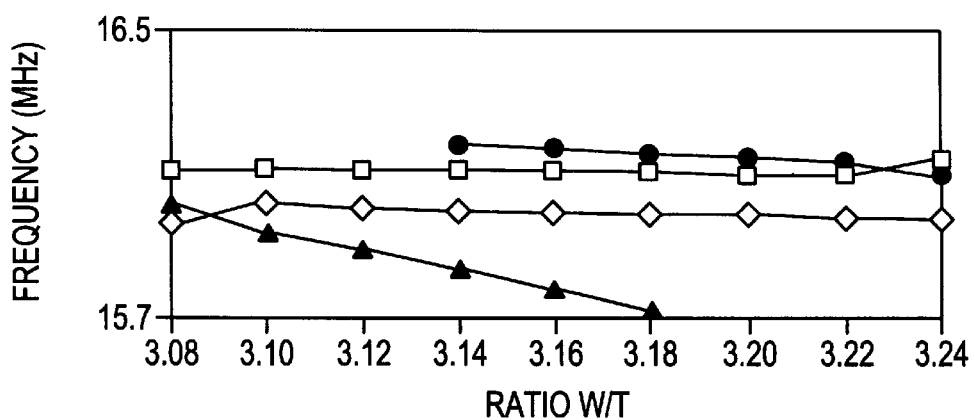
FIG. 13 illustrates the influences of lower and higher spurious responses when the ratio W/T is varied around 3.16 according to a preferred embodiment of the present invention.

FIG. 13 illustrates that, when W/T ranges from about 3.1 to about 3.22, i.e., when W/T is in a range of about 3.16±2%, the lower and higher spurious responses A and B produce less adverse influences on the resonance characteristics. As a result, excellent resonance characteristics are obtained.

Figure 14:
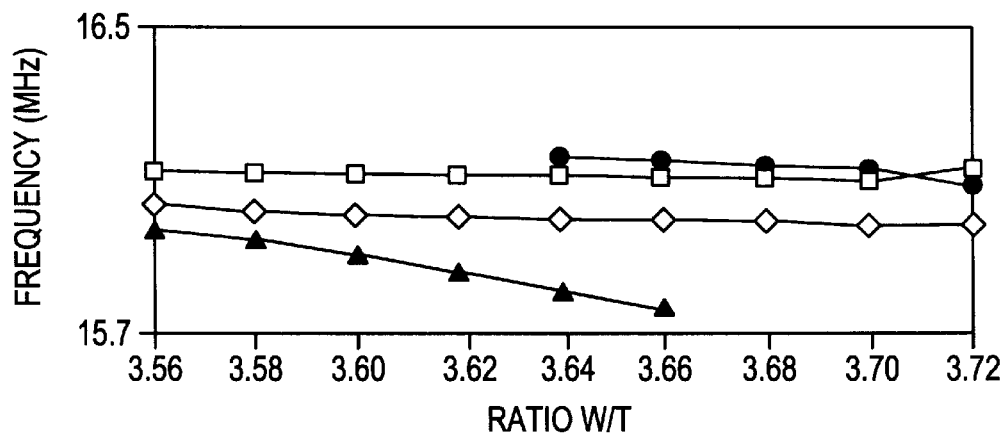
FIG. 14 illustrates the influences of lower and higher spurious responses when the ratio W/T is varied around 3.64 according to a preferred embodiment of the present invention.

As is seen from FIG. 14, when W/T ranges from about 3.57 to about 3.71, i.e., when W/T is in a range of about 3.64± 2%, the lower and higher spurious responses A and B produce less adverse influences on the resonance characteristics. As a result, excellent resonance characteristics are achieved.

As is seen from FIGS. 7 through 14, the piezoelectric resonator 1 is configured so that the ratio W/T is about 0.88±5%, about 1.06±4%, about 1.32±5%, about 1.80±3%, about 2.30±3%, about 2.69±3%, about 3.16±2%, or about 3.64±2%. It is thus possible to obtain a piezoelectric resonator utilizing the third-order wave of the thickness-extension vibration mode which provides excellent resonance characteristics.

Further, unlike the prior art strip-type thickness extensional piezoelectric resonator, the thickness extensional piezoelectric resonator 1 according to the preferred embodiments of the present invention effectively suppresses unwanted spurious vibrations caused by lateral-mode vibrations, as will be described by referring to FIGS. 15–19.

Figure 17:
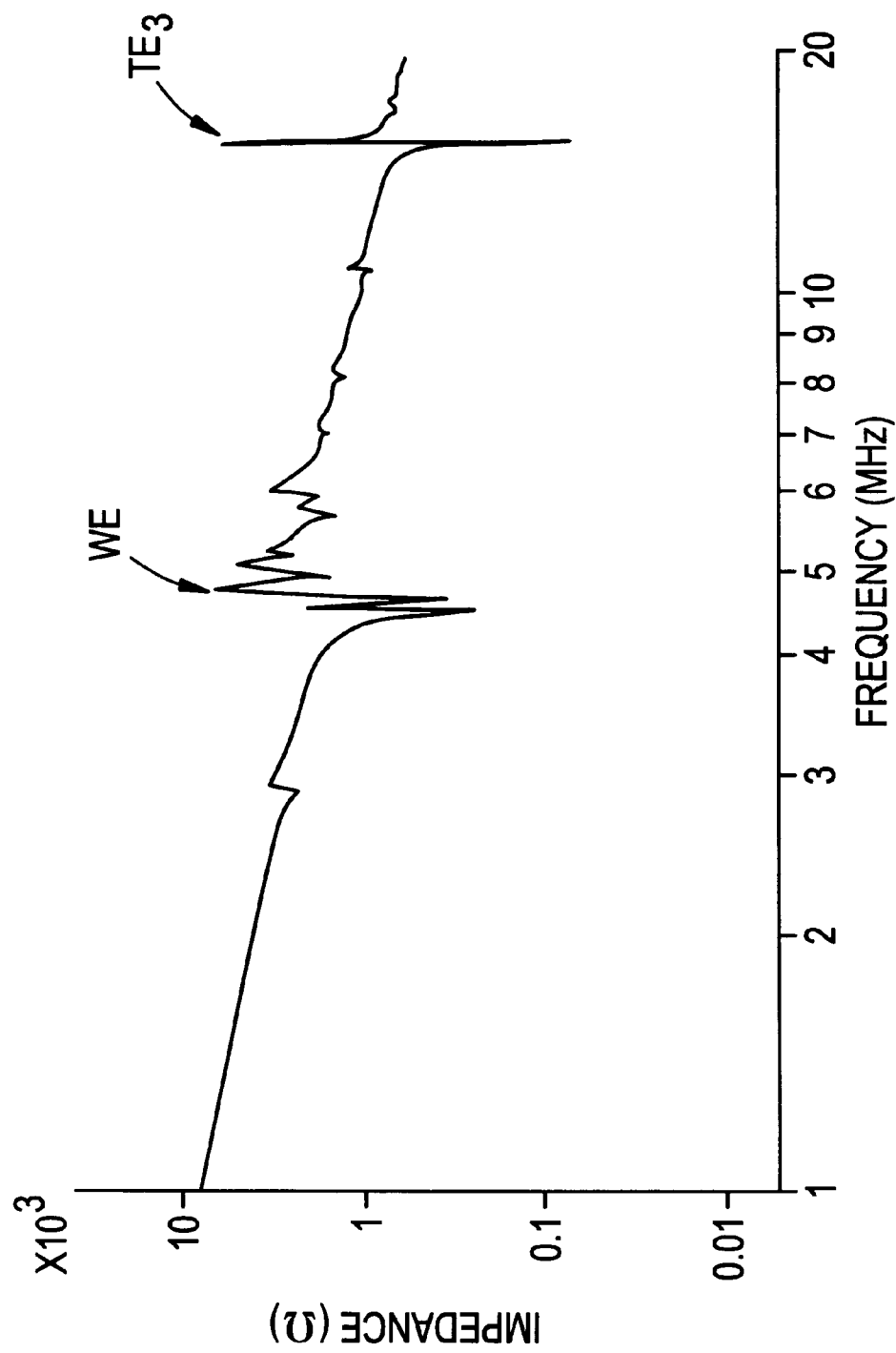
FIG. 17 is a diagram illustrating the impedance-frequency characteristics, depicting lateral modes WE appearing as spurious vibrations in the conventional thickness extensional piezoelectric resonator.
Figure 21:
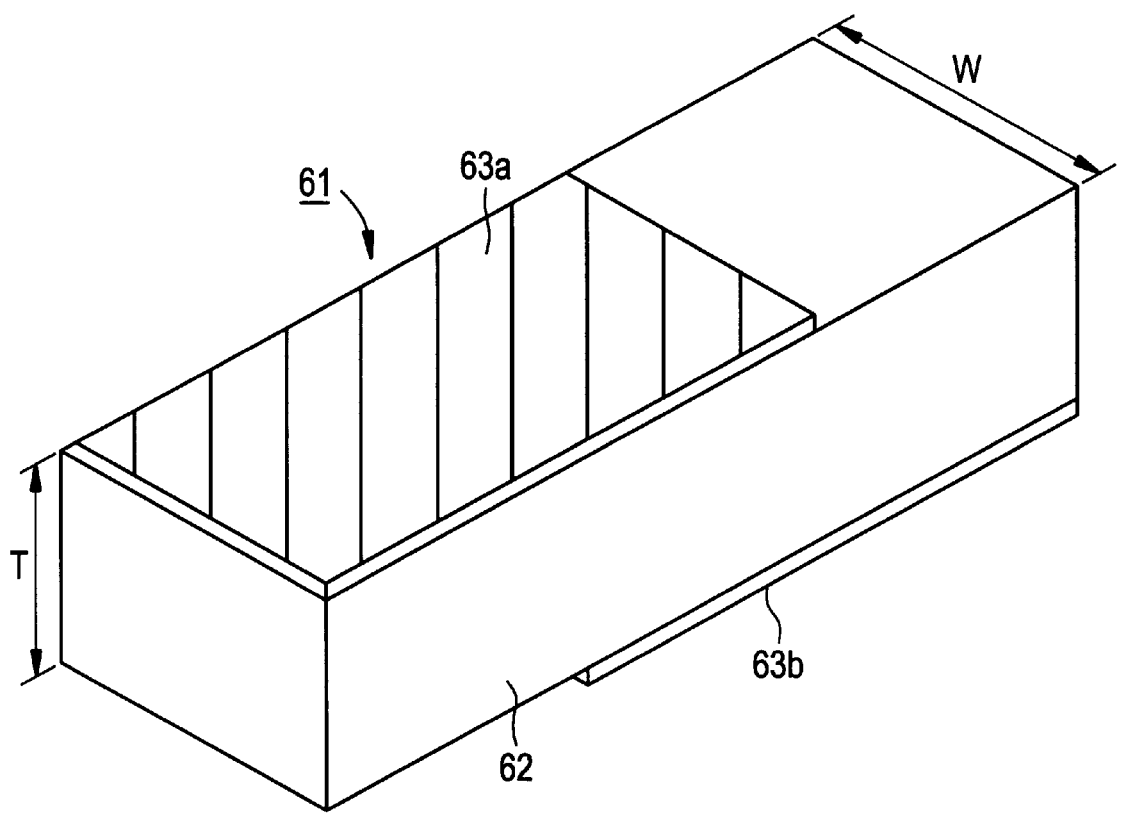
FIG. 21 is a perspective view illustrating another example of conventional energy-trapping piezoelectric resonators utilizing the thickness-extension vibration mode.

In the prior art strip-type piezoelectric resonator 61 shown in FIG. 21, a lateral mode determined by the width W of a piezoelectric substrate 61 produces strong resonance. The impedance-frequency characteristic of this prior art piezoelectric resonator 61 is shown in FIG. 17, where a vibration mode indicated by the arrow $TE_3$ is the third-order wave of a thickness extension vibration mode and responses indicated by WE are spurious vibrations caused by the lateral mode. The impedance-frequency characteristic shown in FIG. 17 is the characteristic of the piezoelectric resonator 61 having a resonance frequency (a resonance frequency of the third-order wave) of 16 MHz. As can be seen from FIG. 17, a lateral-mode spurious vibration indicated by WE appears around 5–6 MHz strongly.

Figure 15:
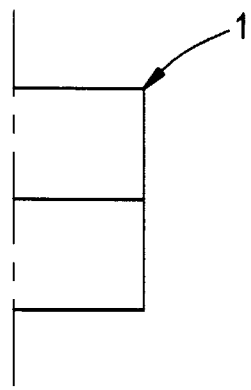
FIG. 15 is a horizontal cross section of a thickness extensional piezoelectric resonator of a preferred embodiment of the present invention in a strip form.
Figure 16:
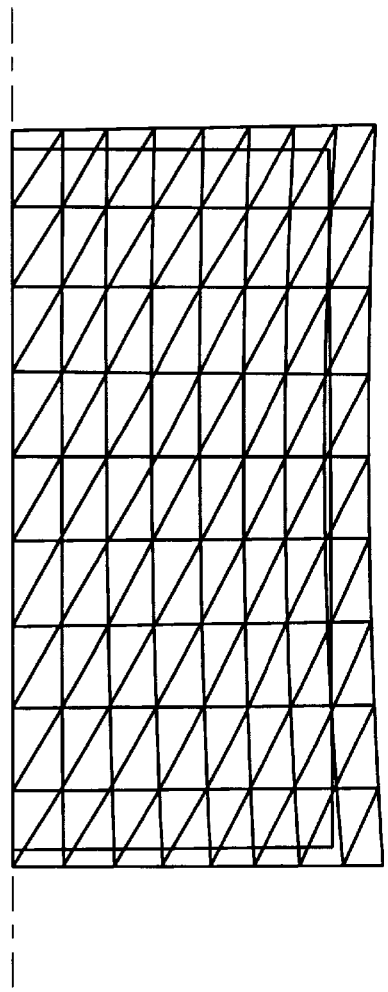
FIG. 16 is a diagram illustrating the distribution of displacements in a lateral mode WE of a piezoelectric body, the distribution being analyzed by the finite element method.

We have analyzed the displacements of the piezoelectric resonator at the lateral-mode spurious vibrations WE. Results shown in FIG. 16 have been obtained. FIG. 16 schematically shows the displacements of surfaces of the strip-type piezoelectric resonator when taken in a direction perpendicular to the longitudinal direction and in the direction of thickness, as shown in FIG. 15. FIG. 15 is a horizontal cross section of a thickness extensional piezoelectric resonator having a strip form.

Figure 18:
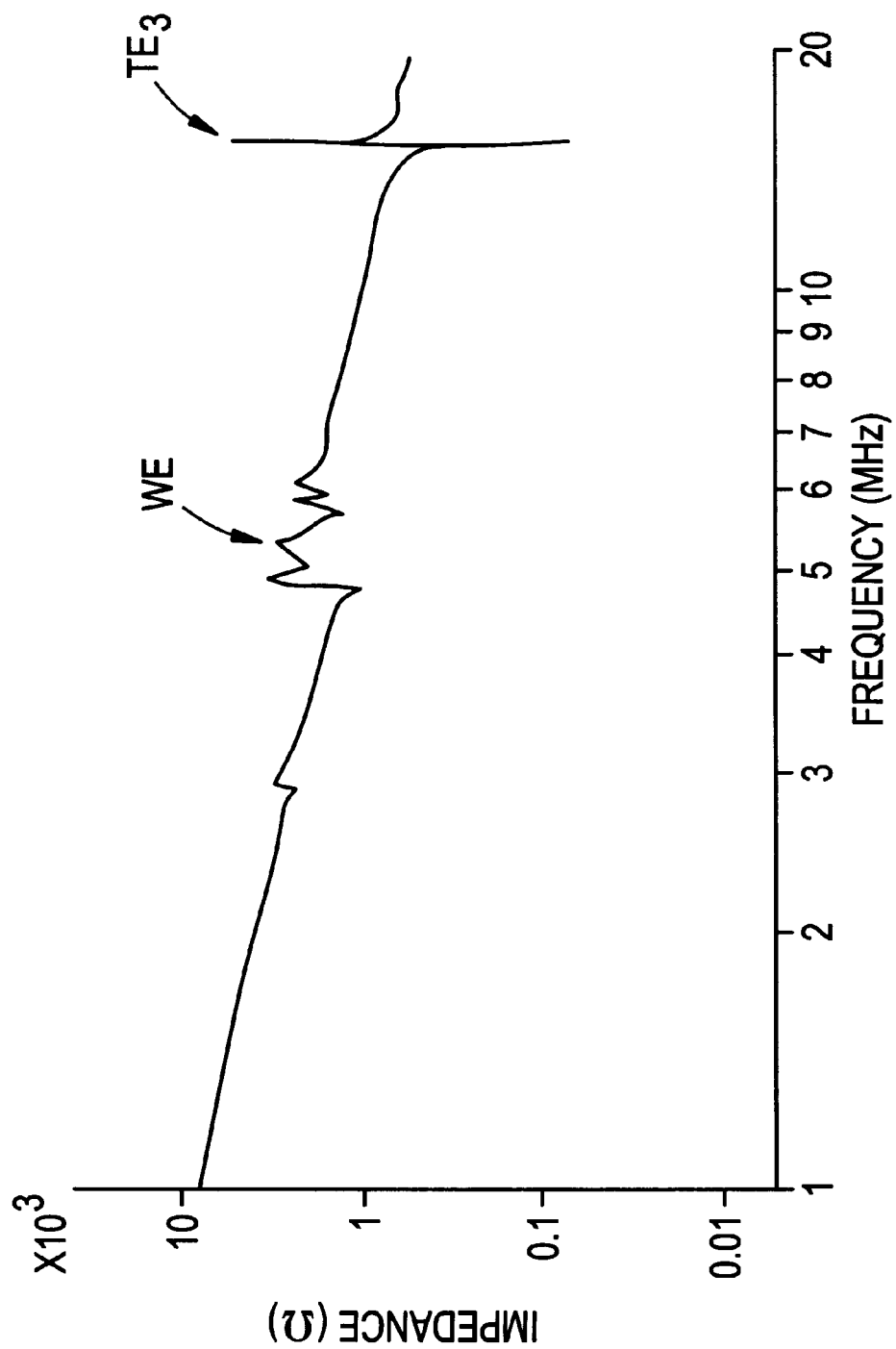
FIG. 18 is a diagram illustrating the impedance-frequency characteristics of a thickness extensional piezoelectric resonator according to a first preferred embodiment of the invention.

It was discovered that that if the piezoelectric strip 2 of the thickness extensional piezoelectric resonator 1 shown in FIG. 1 is made of certain materials, the responses of the lateral modes WE are significantly reduced and only the third-order wave $TE_2$ of the thickness extension vibration mode is excited strongly, to thereby suppress the spurious vibrations caused by the lateral modes WE described above. The impedance-frequency characteristic of the piezoelectric resonator 1 obtained according to this discovery is shown in FIG. 18. The impedance-frequency characteristic is derived under conditions where the piezoelectric strip 2 is formed of a lead titanate-based piezoelectric ceramic wherein $-d_{31}= 9 \times 10^{-12}$ C/N. As can be seen from FIG. 18, in the piezoelectric resonator 1 according to the present preferred embodiment, the third-order wave of the thickness extension vibration mode indicated by the arrow $TE_3$ is excited strongly. The magnitude of the lateral-mode spurious vibration WE is significantly decreased.

On the other hand, the characteristic shown in FIG. 17 is derived from the piezoelectric strip 2 made of a lead titanate zirconate-based ceramic with $d_{31}=-42 \times 10^{-12}$ C/N.

Where the piezoelectric strip 2 is made of the above-described lead zirconate titanate-based ceramic, a significantly improved and excellent characteristic was obtained as shown in FIG. 18. In view of this fact, the piezoelectric constant $d_{31}$ of the piezoelectric material used to form the piezoelectric strip 2 was varied, and the resulting relative bandwidths were examined by the finite element method. The results are given in FIG. 19. In FIG. 18, ● indicates a relative bandwidth of the third-order wave $TE_3$ and ○ indicates a relative bandwidth of the lateral mode WE.

The relative bandwidth is given by $(fa-fr) \times 100/fa (\%)$ where fr is a resonant frequency and fa is an anti-resonant frequency.

Figure 19:
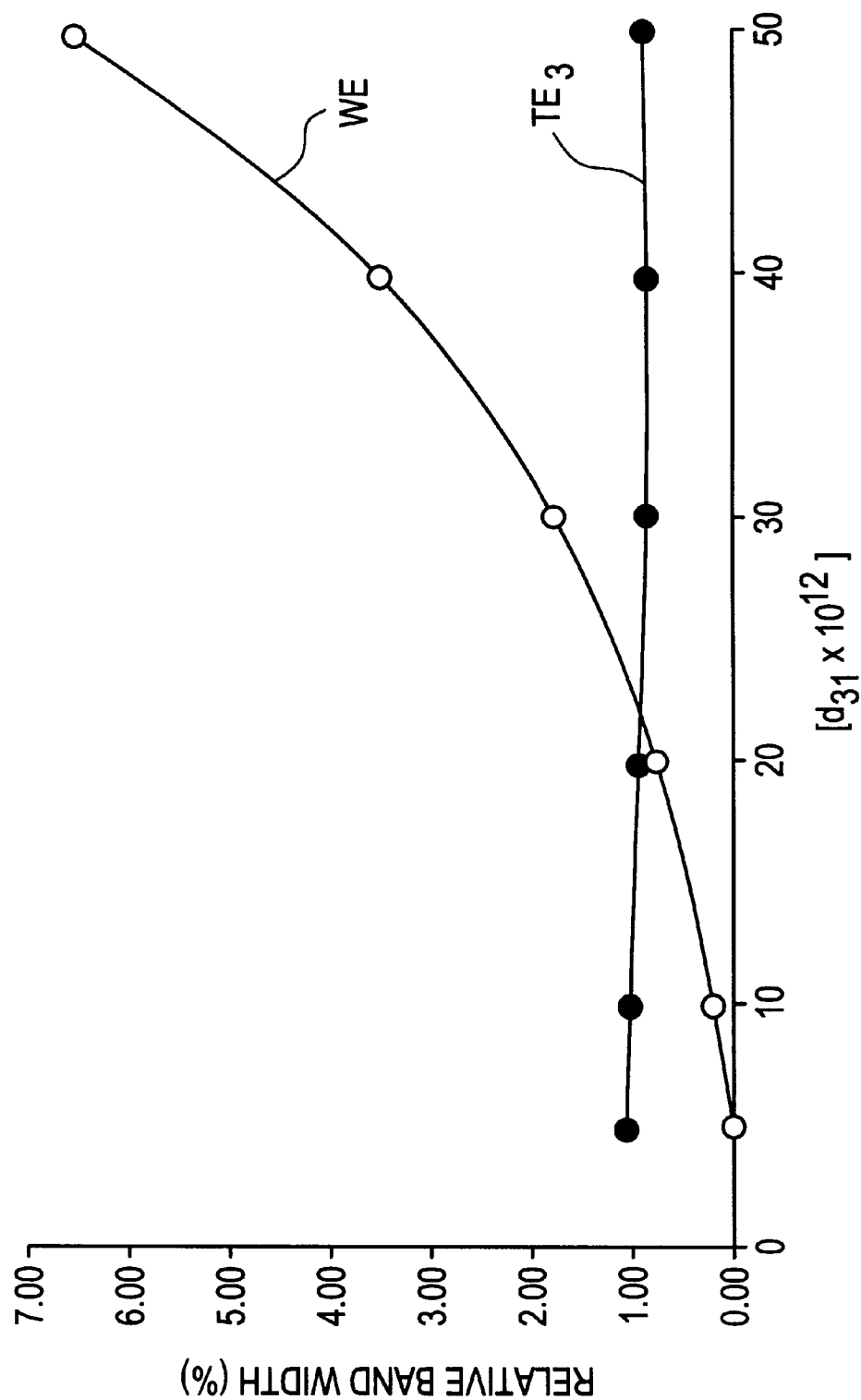
FIG. 19 is a diagram illustrating the relation between the absolute value of piezoelectric constant $d_{31}$ and a relative bandwidth.
Figure 20:
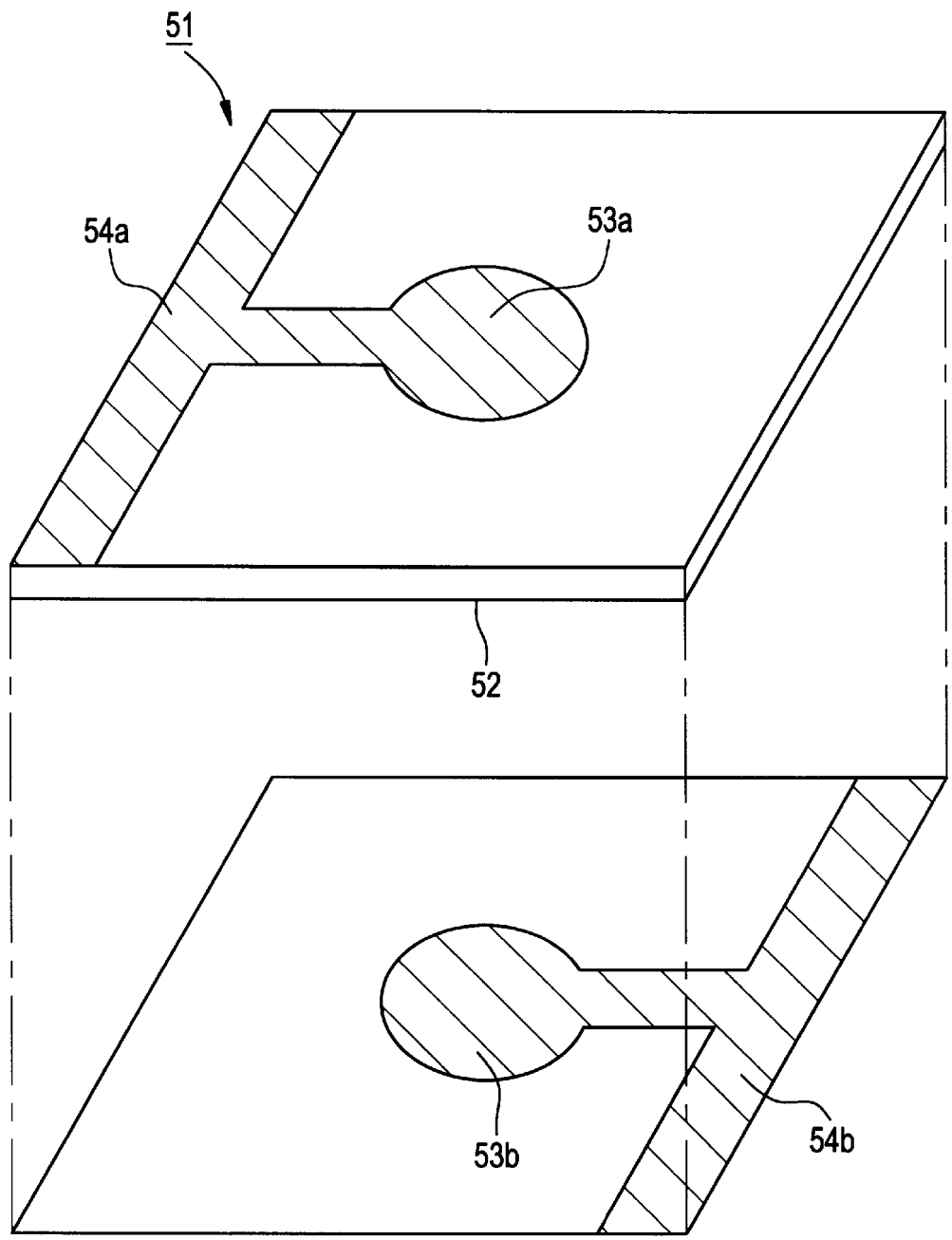
FIG. 20 is a partially exploded perspective view illustrating an example of conventional energy-trapping piezoelectric resonators utilizing the thickness-extension vibration mode.

As can be seen from FIG. 19, if the piezoelectric constant $d_{31}$ is varied, the relative bandwidth changes. Especially, where the constant exceeds $20 \times 10^{-12}$ C/N, the lateral-mode WE increases. Therefore, it can be understood that where the piezoelectric constant $d_{31}$ is set less than $20 \times 10^{-12}$ C/N, the responses of the lateral modes WE can be effectively suppressed without reducing the response of the third-order wave $TE_3$.

In the thickness extensional piezoelectric resonator 1 according to the present preferred embodiment, the absolute value of the piezoelectric constant $d_{31}$ of the piezoelectric material is preferably set less than $20 \times 10^{-12}$ C/N. Therefore, it can be observed that, where the piezoelectric resonator uses the third-order wave $TE_3$ of a thickness extensional vibration mode, unwanted spurious vibrations due to the lateral mode WE can be effectively suppressed. Consequently, excellent resonant characteristics can be obtained.

The energy-trapping piezoelectric resonator 1 described above is adapted and arranged to be used in a variety of piezoelectric resonance components, such as piezoelectric filters or piezoelectric oscillators. As an example of such components, a capacitor-integrating piezoelectric oscillator using the above type of resonator 1 is shown in FIG. 2.

Figure 2:
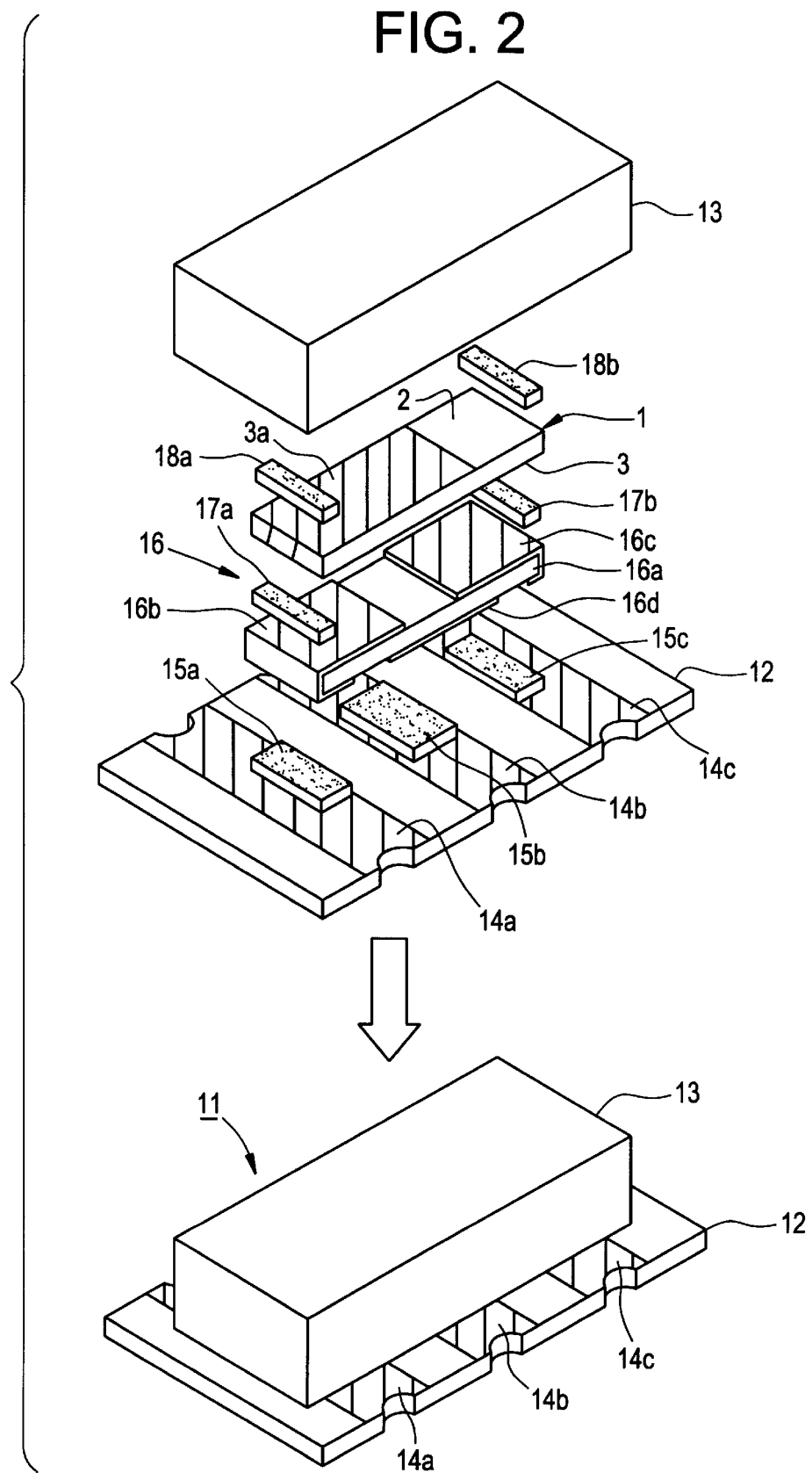
FIG. 2 is an exploded perspective view illustrating a capacitor-integrating piezoelectric resonator as a piezoelectric resonance component formed by using the piezoelectric resonator shown in FIG. 1.

A piezoelectric oscillator generally designated by 11 has, as illustrated in FIG. 2, a base member 12 and a case 13 which has an opening which extends downwardly. Terminal electrodes 14a, 14b and 14c for connecting the oscillator 11 to an exterior electronic component are arranged at a predetermined interval to cover the whole width of the base member 12.

A capacitor 16 is fixed to the terminal electrodes 14a, 14b and 14c via conductive adhesives 15a, 15b and 15c, respectively. The capacitor 16 preferably includes a dielectric substrate 16a made of a dielectric material, such as a dielectric ceramic. Capacitor electrodes 16b, 16c are provided on the dielectric substrate 16a at a predetermined pitch and extend from the upper surface to the lower surface of the substrate 16a via the lateral surfaces. The portions of the capacitor electrodes 16b and 16c which are disposed on the lower surface of the substrate 16a are electrically connected to the terminal electrodes 14a and 14c via the above-described conductive adhesives 15a and 15c, respectively.

A common electrode 16d is located at the central portion of the lower surface of the dielectric substrate 16a. The common electrode 16d opposedly faces part of the capacitor electrodes 16b and 16c provided on the dielectric substrate 16a. Thus, a three-terminal capacitor including the capacitor electrodes 16b and 16c and the common electrode 16d is configured. The common electrode 16d is also electrically connected to the terminal electrode 14b disposed on the base member 12 via the conductive adhesive 15b.

The energy-trapping piezoelectric resonator 1 of the foregoing preferred embodiment is bonded to the capacitor 16 preferably via conductive adhesives 17a and 17b. More specifically, the second electrode 3b on the lower surface of the resonator 1, such as the one shown in FIG. 1, is electrically connected to the capacitor electrode 16c of the capacitor 16 via the conductive adhesive 17b. Further, the first electrode 3a is extended from the upper surface to the lower surface of the piezoelectric substrate 2 via one of the lateral surfaces and is further electrically connected to the capacitor electrode 16b of the capacitor 16 via the conductive adhesive 17a.

Insulating adhesives 18a and 18b are preferably used to bond the case 13 to the piezoelectric resonator 1, though the adhesives 18a, 18b are not essential. Since the case 13 as viewed from the top is smaller than the base member 12, the terminal electrodes 14a, 14b and 14c are exposed when the case 13 is assembled on the base member 12, as shown in lower part of FIG. 2. By virtue of the exposed terminal electrodes 14a, 14b and 14c, the piezoelectric oscillator can be directly surface-mounted on a printed circuit board.

As is readily apparent from the foregoing description, the energy-trapping piezoelectric resonator of the preferred embodiments of the present invention offers the following advantages.

The first and second electrodes are disposed on the top and bottom surfaces of the piezoelectric substrate, which is polarized along its thickness, to cover the whole width, and opposedly face each other at the central portion of the substrate in the longitudinal direction where a resonance portion is formed. Further, since the ratio W/T of the width W to the thickness T of the substrate is preferably set to be within one of the ranges described above, unwanted spurious responses in the vicinity of the resonant frequency fr and the anti-resonant frequency fa can be effectively suppressed. It is therefore possible to provide a piezoelectric resonator which has a great frequency difference between the resonant frequency fr and the anti-resonant frequency fa and thus exhibits good resonance characteristics.

Moreover, since the first and second electrodes of the resonator are disposed on the substrate in the above manner, a large extra area of the piezoelectric substrate around the resonance portion formed by the opposing region between the first and second electrodes is not required. Consequently, the size of the piezoelectric resonator can be reduced, thereby further improving the miniaturization of a piezoelectric oscillator or a piezoelectric filter formed by using the above type of resonator.

Further, the first electrode is extended to reach one edge in the widthwise direction of the piezoelectric substrate and the second electrode is extended to reach the other edge in the widthwise direction of the piezoelectric substrate. Therefore, the piezoelectric resonator is easy to mount on a printed circuit board and it is also easy to be connected to another chip-type electronic component, such as a capacitor. By use of such a compact piezoelectric resonator providing excellent resonance characteristics, the miniaturization of various types of piezoelectric resonance components can also be enhanced.

What is claimed is:

1. An energy-trapping piezoelectric resonator vibrating in a third-order wave of a thickness-extension vibration mode, comprising:

a piezoelectric substrate polarized in a direction of thickness thereof, a ratio W/T of a width W to a thickness T of said piezoelectric substrate being approximately one of 0.88±5%, 1.06±4%, 1.32±5%, 1.80±3%, 2.30±3% 2.69±3% 3.16±2%, or 3.64±2%, the piezoelectric resonator being adapted to generate the third order wave of the thickness-extension vibration mode as a main vibration of the resonator while suppressing spurious vibrations caused by a lateral mode vibration; and first and second electrodes respectively disposed on top and bottom surfaces of said piezoelectric substrate to cover substantially the entire width of said piezoelectric substrate and opposedly facing each other at a central portion of said piezoelectric substrate in a longitudinal direction thereof.

2. An energy-trapping piezoelectric resonator according to claim 1, wherein said first electrode is extended to reach one lateral edge in a widthwise direction of said piezoelectric substrate and said second electrode is extended to reach the other lateral edge in the widthwise direction of said piezoelectric substrate.

3. An energy-trapping piezoelectric resonator according to claim 1, wherein a piezoelectric constant $d_{31}$ of a piezoelectric material constituting said piezoelectric substrate is defined by $|d_{31}| \leq 20 \times 10^{-12}$ C/N.

4. An energy-trapping piezoelectric resonator according to claim 2, wherein a piezoelectric constant $d_{31}$ of a piezoelectric material constituting said piezoelectric substrate is defined by $|d_{31}| \leq 20 \times 10^{\times 12}$ C/N.

* * * * *